United States Patent
Itoga et al.

(10) Patent No.: US 7,253,040 B2
(45) Date of Patent: Aug. 7, 2007

(54) FABRICATION METHOD OF SEMICONDUCTOR DEVICE

(75) Inventors: Takashi Itoga, Nara (JP); Yutaka Takafuji, Nara (JP); Yoshihiro Yamamoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 444 days.

(21) Appl. No.: 10/910,620

(22) Filed: Aug. 4, 2004

(65) Prior Publication Data

US 2005/0032283 A1  Feb. 10, 2005

(30) Foreign Application Priority Data

Aug. 5, 2003  (JP) ............... 2003-206111
Sep. 1, 2003  (JP) ............... 2003-308859

(51) Int. Cl.
  *H01L 21/00*  (2006.01)
  *H01L 21/84*  (2006.01)
(52) U.S. Cl. .................... 438/155; 438/152
(58) Field of Classification Search ............... 257/347, 257/350, 51, 57; 438/151–155, 162, 798
  See application file for complete search history.

(56) References Cited

U.S. PATENT DOCUMENTS 5,637,187 A  6/1997  Takasu et al. ............. 438/30
6,067,062 A  5/2000  Takasu et al. ............. 345/87
2004/0061176 A1  4/2004  Takafuji et al.

FOREIGN PATENT DOCUMENTS

| EP | 1 463 105 A2 | 9/2004 |
|---|---|---|
| JP | 2-60163 A | 2/1990 |
| JP | 5-206408 A | 8/1993 |
| JP | 6-204440 A | 7/1994 |
| JP | 10-293322 | 11/1998 |
| JP | 11-17107 A | 1/1999 |
| JP | 11-24106 | 1/1999 |
| JP | 11-24106 A | 1/1999 |
| WO | 93/15589 A1 | 8/1993 |

*Primary Examiner*—Calvin Lee
(74) *Attorney, Agent, or Firm*—Nixon & Vanderhye P.C.

(57) ABSTRACT

An insulating substrate is bonded to a monocrystalline Si substrate that includes a monocrystalline Si thin film transistor and a hydrogen ion implanted portion. After depositing an amorphous Si thin film, the amorphous Si thin film is modified into a polycrystalline Si thin film by irradiation of the excimer laser. In laser irradiation, the irradiation of the laser beam on the monocrystalline Si thin film transistor is blocked either by inserting a mask in part of the optical path of the laser beam, or by irradiating the laser beam before unnecessary portions of the monocrystalline Si substrate is detached. In this way, the irradiation of the laser beam for forming the polycrystalline Si thin film will not damage the monocrystalline Si thin film transistor in a semiconductor device in which the monocrystalline Si thin film transistor, which has been transferred, and the polycrystalline Si thin film transistor, which has been formed on the insulating substrate, are formed on the insulating substrate.

8 Claims, 6 Drawing Sheets

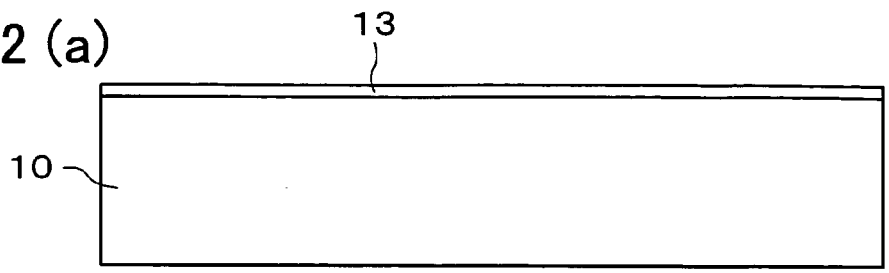
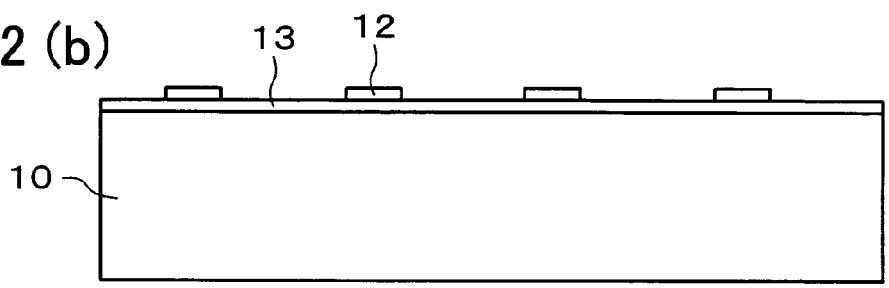
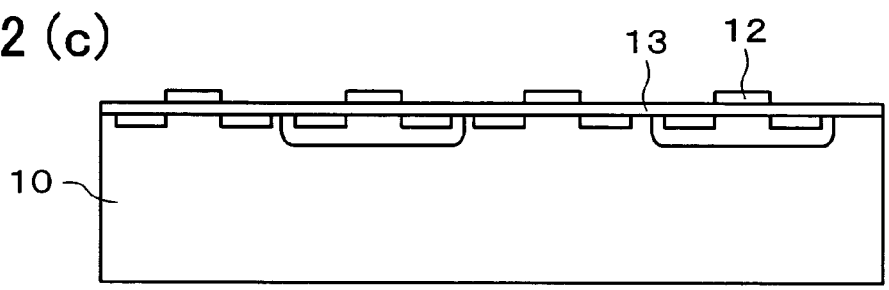
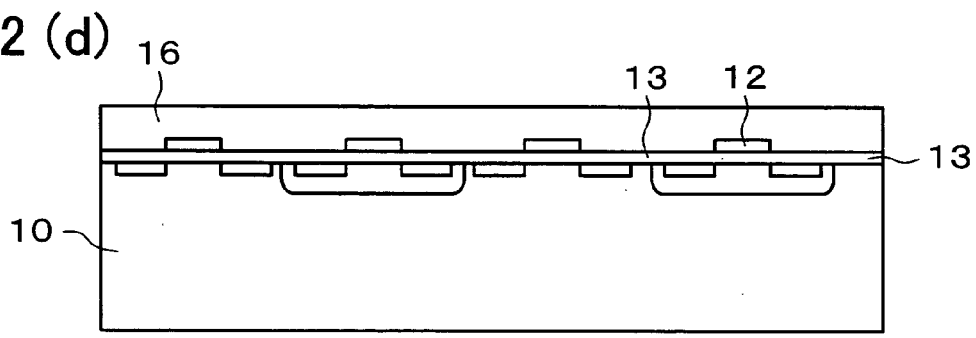
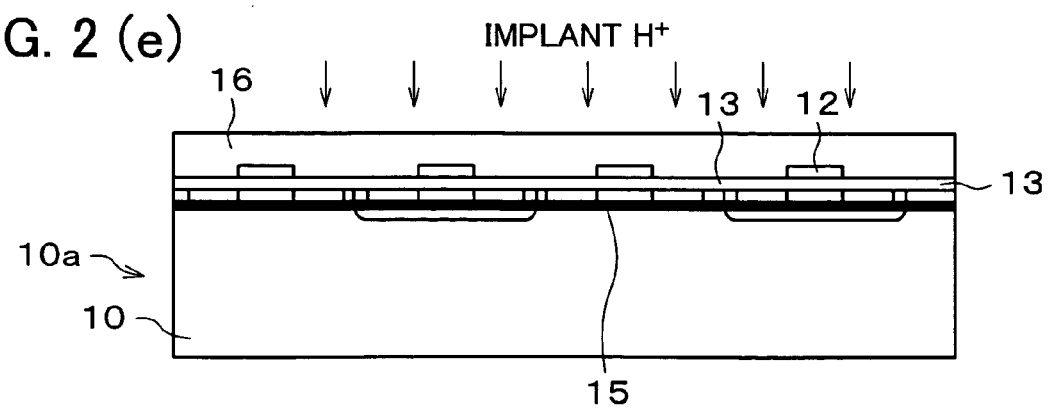

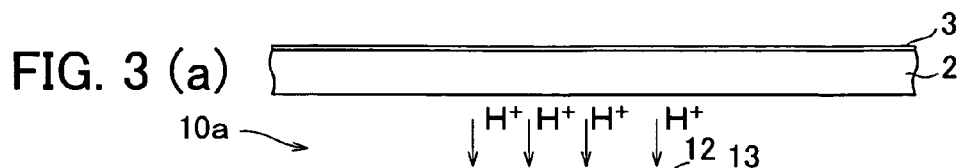
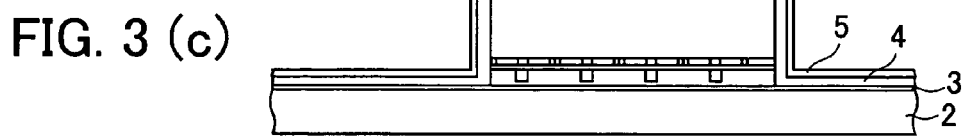
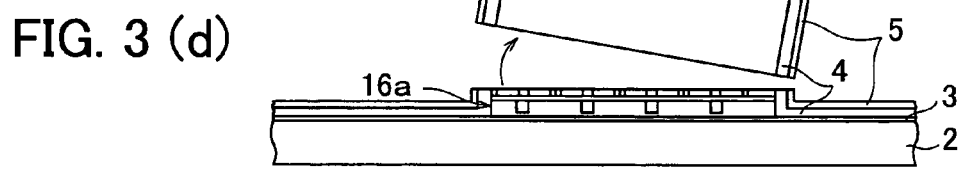
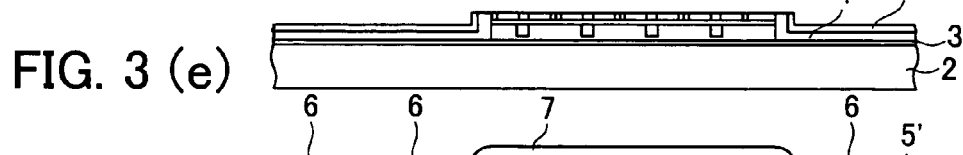
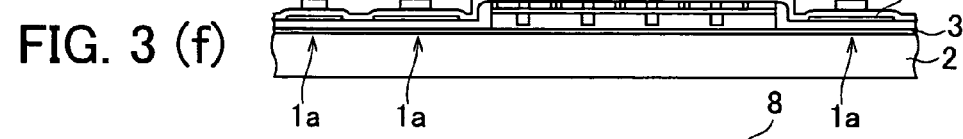
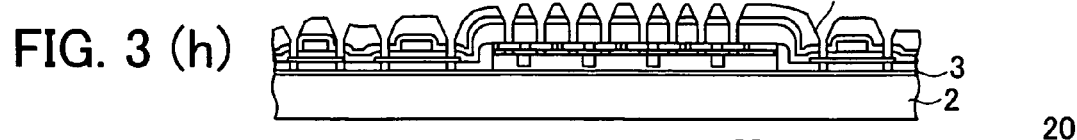
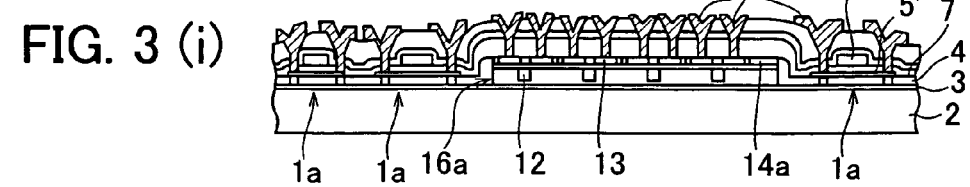

FABRICATION METHOD OF SEMICONDUCTOR DEVICE

This Nonprovisional application claims priority under 35 U.S.C. § 119(a) on Patent Application No. 2003-206111 filed in Japan on Aug. 5, 2003, and No. 2003-308859 filed in Japan on Sep. 1, 2003, the entire contents of which are hereby incorporated by reference.

FIELD OF THE INVENTION

The present invention relates to a fabrication method of a semiconductor device with two kinds of transistors of different characteristics formed on a single substrate. Particularly, the invention relates to a semiconductor device fabrication method for improving circuit performance of a display device when a peripheral driving circuit and a control circuit are integrated on a single substrate in, for example, active-matrix liquid crystal display devices, active-matrix organic EL display devices and the like that employ TFT driving.

BACKGROUND OF THE INVENTION

With the recent pervasion of personal information terminals using a computer or flat display panel, there has been rapid development of technologies involving integrated circuit element, TFT (Thin Film Transistor)-liquid crystal display, or TFT-organic EL display.

For example, in the integrated circuit element technology, a commercially-available monocrystalline Si (silicon) wafer, circular in shape with a thickness of less than 1 mm and a diameter of about 20 mm, is processed and about several hundred million transistors are formed on the monocrystalline Si wafer.

The TFT-liquid crystal display or TFT-organic EL display technology now employs a technique in which pixels or drivers of the liquid crystal display are made first by forming an amorphous Si film ("a-Si" hereinafter) or a polycrystalline semiconductor film such as a polycrystalline Si film ("p-Si" hereinafter) on a light-transmissive amorphous substrate such as a glass substrate, and then by processing such a film into a thin film transistor ("TFT" hereinafter). For example, display devices that drive the liquid crystal display, organic EL display, and the like by a method of driving generally known as active-matrix driving have been used, wherein the active-matrix driving is realized by the MOS transistor, used as a switching element, which is processed out of an amorphous Si film deposited on a high-strain-point glass substrate. The MOS transistor is formed by melting the amorphous Si film with the heat of a heat source such as a laser, so as to achieve a polycrystalline state in the amorphous Si film.

Particularly common is one with integrated peripheral drivers using p-Si that offers fast operation by its high mobility.

For the system integration of high-performance devices such as an image processor or timing controller, there is a demand for a Si device with better performance.

The need for better performance arises from the insufficient performance of the transistor for making a high-performance Si device, owning to the fact that the mobility is decreased or S coefficient (sub-threshold coefficient) is increased by the presence of a local level in the gap caused by the incomplete crystallinity of the polycrystalline Si, or by the presence of a defect or such a gap local level in the vicinity of a crystal grain boundary.

In light of such a drawback, there has been active research since the 1980's on a so-called SOI (silicon on insulator) technique, in which a monocrystalline Si thin film is formed on a substrate whose amorphous portion is in contact with the Si film. Note that, as the term is used herein, "SOI" refers to the act of forming the monocrystalline Si film on an insulating substrate, or a structure in which the monocrystalline Si film is formed on an insulating substrate. (Generally, the term "SOI" is used when the monocrystalline Si film is formed as a Si layer.)

In the field of integrated circuit, the SOI substrate is used to make desirable transistors and thereby drastically improve the functions of the semiconductor element. Generally, the type of substrate on which the monocrystalline Si film is formed in the integrated circuit is not particularly limited as long as it is an insulator. The substrate may be transparent or non-transparent, or crystalline or amorphous. Further, with the elements completely isolated, the integrated circuits have less restriction in term of operation. Thus, by making the transistor using the SOI substrate, desirable characteristics and high performance can be realized at the same time.

For improved performance of the Si device, a technique of making a semiconductor device has been researched, in which the semiconductor device is formed by first processing a monocrystalline Si thin film into a device such as a thin film transistor, and then by bonding the thin film transistor on an insulating substrate. (For example, see International Publication No. WO93/155898, J. P. Salerno "Single Crystal Silicon AMLCDs", Conference Record of the 1994 International Display Research Conference (IDRC), pp. 39-44 (1994), Q.-Y. Tong & U. Gesele, SEMICONDUCTOR WAFER BONDING: SCIENCE AND TECHNOLOGY, John Wiley & Sons, New York (1999)).

For example, Japanese Publication for Unexamined Patent Application No. 17107/1999 (Tokukaihei 11-17107, published on Jan. 22, 1999) (Publication 1) discloses a technique in which a two-dimensional LSI made from a monocrystalline silicon layer is formed on a porous silicon layer formed on a monocrystalline silicon substrate, and a supporting substrate is bonded to a surface of the two-dimensional LSI, before the two-dimensional LSI is detached from the monocrystalline silicon substrate in portions of the porous silicon layer.

In the SOI device, the monocrystalline Si is solely formed on the Si wafer having an insulating film, as disclosed in this publication. In fabricating a latch-up free or completely depleted element, this is advantageous over the bulk monocrystalline Si element that is directly made out of a Si wafer. However, due to chip size restriction etc., the applicable area of the SOI device has been limited to the fields of ICs and LSIs, including the semiconductor memory element.

This makes the use of the SOI device solely made of monocrystalline Si difficult when the semiconductor device is to be formed on a large-area light-transmissive amorphous substrate as in the active-matrix display device. In order to avoid such a drawback, the active-matrix display device generally adopts a structure in which a non-monocrystalline Si device is formed on a large-area light-transmissive substrate such as a glass substrate.

However, when used alone, it is extremely difficult for the non-monocrystalline Si device to match its performance with that of the monocrystalline Si device. For example, a non-monocrystalline Si thin film transistor (low-temperature polycrystalline Si thin film transistor, etc.) formed on a high-strain-point glass substrate by being crystallized by irradiation of an energy beam has incomplete crystallinity and therefore it can achieve a mobility of only about 300 cm²/VS even when it is an NMOS transistor. This arises from the insufficient performance of the transistor for making a high-performance Si device, owing to the fact that the mobility is decreased or S coefficient (sub-threshold coefficient) is increased by the presence of a local level in the gap caused by the incomplete crystallinity of the polycrystalline Si, or by the presence of a defect or such a gap local level in the vicinity of a crystal grain boundary.

That is, while the common method of depositing the amorphous Si film and crystallizing it into a polycrystal by irradiation of an energy beam may be sufficient to raise the performance of the Si film to the level of monocrystalline Si, it is insufficient to exactly match the performance of the Si film to that of the monocrystalline Si film. Thus, in order to obtain the very same performance of the monocrystalline Si device with the non-monocrystalline Si device alone, a further technical breakthrough is needed, requiring many more stages of development.

Note that, the source driver (data driver) of the active-matrix display device can still meet the requirements of required performance as a source driver even when devices of the same material are monolithically mounted on a single glass substrate. However, for devices (controller, D/A converter, etc.) that need to satisfy tougher requirements for their characteristics, it is difficult to monolithically mount devices of the same material on a single glass substrate and still obtain uniform threshold voltages and uniform elements with high mobility. That is, required characteristics cannot be obtained.

As another method of forming a high-performance semiconductor device, a method is available in which two kinds of semiconductor devices with different characteristics are formed on a single substrate. For example, Japanese Publication for Unexamined Patent Application No. 24106/1999 (Tokukaihei 11-24106, published on Jan. 29, 1999) (Publication 2) discloses a technique in which a substrate for a liquid crystal panel is fabricated by transferring polycrystalline silicon TFTs from one substrate to another substrate on which pixel regions with amorphous silicon TFTs have been formed.

It should be noted here that the foregoing publications 1 and 2 assume a construction in which a monocrystalline Si device and a polycrystalline Si device are formed on a single insulating substrate, wherein the former has been transferred from a different substrate, and the latter has been deposited on the insulating substrate. In this case, the polycrystalline Si thin film is formed by turning the amorphous Si thin film to a polycrystal by irradiation of a laser beam.

There are two ways to form the two kinds of semiconductor devices, the monocrystalline Si device and the polycrystalline Si device, on the insulating substrate. The first method is to first transfer the monocrystalline Si device on the insulating substrate and then form the polycrystalline Si device. The second method is to first form the polycrystalline Si device on the insulating substrate and then transfer the monocrystalline Si device.

By comparing these two methods, the advantage of the first method in which the polycrystalline Si device is formed after the monocrystalline Si device is transferred is that it allows the monocrystalline Si device to be transferred onto a flat surface of the insulating substrate and thereby prevent the problem of contact failure, etc. However, a drawback of this method is that the monocrystalline Si device is damaged as the laser that irradiates the amorphous Si thin film in the step of turning the amorphous Si thin film to a polycrystal also irradiates the monocrystalline Si device.

More specifically, the energy of the irradiated beam for achieving a polycrystalline state damages the monocrystalline Si device, making it difficult to obtain uniform threshold voltages and uniform elements with high mobility.

SUMMARY OF THE INVENTION

The present invention was made in view of the foregoing problems in a semiconductor device in which a monocrystalline Si device formed by transfer (transferred device) and a polycrystalline Si device deposited on an insulating substrate such as a glass substrate (deposited device) are monolithically formed on the insulating substrate, and an object of the invention is to prevent the transferred monocrystalline Si device from being damaged by the energy beam irradiated to form a polycrystalline Si thin film.

In order to achieve the foregoing object, the present invention provides a fabrication method of a semiconductor device in which a first device and a second device are both formed on an insulating substrate wherein the first device is formed on the insulating substrate with its main portion transferred thereon, and the second device is formed on the insulating substrate by being deposited thereon. The method includes the step of forming the second device after the main portion of the first device is transferred on the insulating substrate, and the step of forming the second device includes the steps of: forming an amorphous Si thin film on the insulating substrate; and modifying the amorphous Si thin film to a polycrystalline Si thin film by irradiation of an energy beam, the energy beam being irradiated except for the main portion of the first device.

In this way, the irradiation of the energy beam for forming the polycrystalline Si thin film will not damage the first device in the semiconductor device in which the first device, which has been transferred, and the second device, which has been formed on the insulating substrate, are formed on the insulating substrate.

For a fuller understanding of the nature and advantages of the invention, reference should be made to the ensuing detailed description taken in conjunction with the accompanying drawings.

BRIEF DESCRIPTION OF THE DRAWINGS

FIG. 2(a) through FIG. 2(e) are cross sectional views showing fabrication steps of a transferred monocrystalline Si substrate in the semiconductor device in one embodiment of the present invention.

FIG. 3(a) through FIG. 3(i) are cross sectional views showing fabrication steps of the semiconductor device in one embodiment of the present invention.

DESCRIPTION OF THE EMBODIMENTS

First Embodiment

Figure 1:
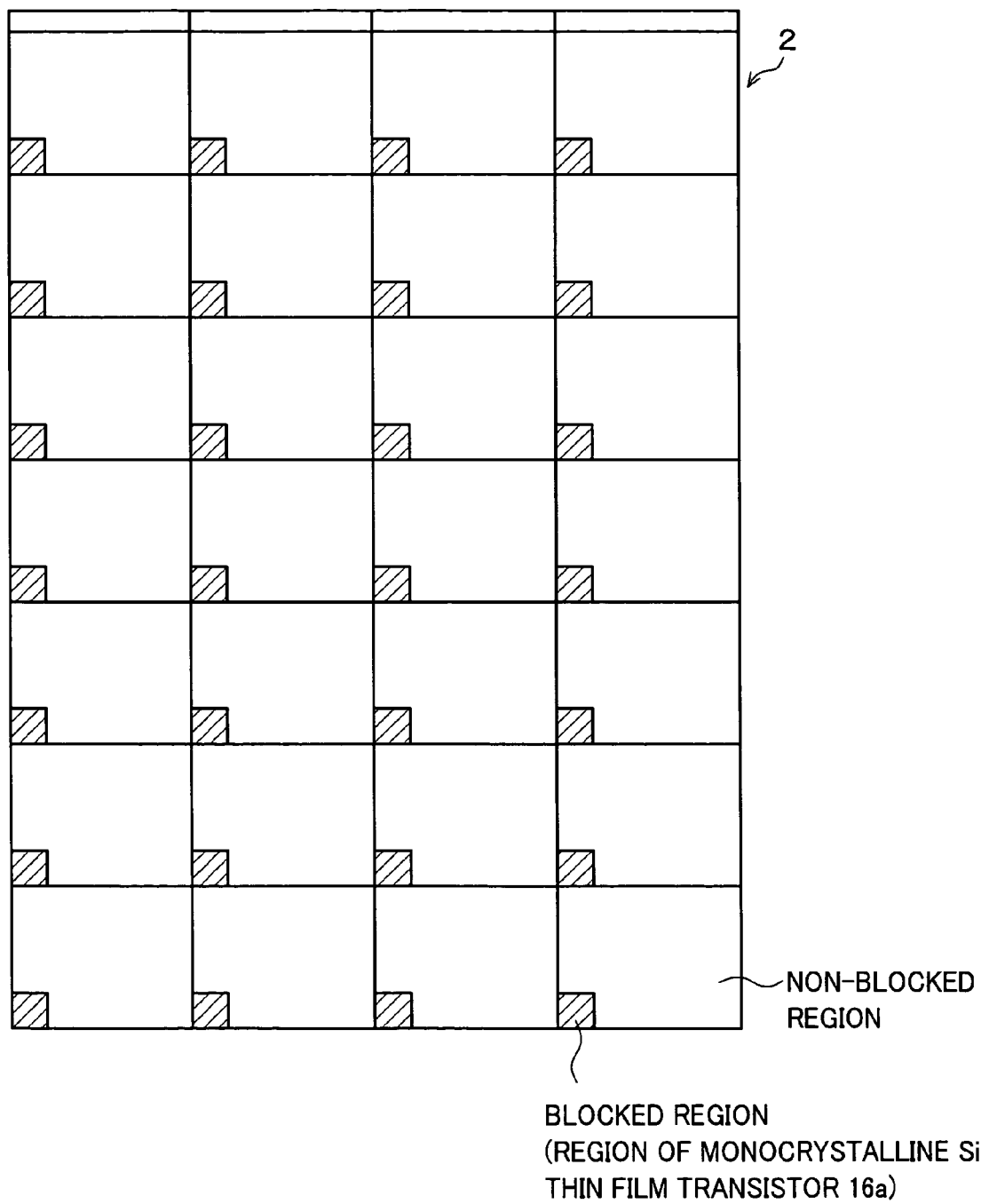
FIG. 1 is a plan view showing regions irradiated with an energy laser in a fabrication step of a semiconductor device in one embodiment of the present invention.

One embodiment of the present invention is described below with reference to the attached drawings.

As described herein, a semiconductor device of the present embodiment provides improved performance and improved functionality by forming a MOS polycrystalline Si thin film transistor (deposited device, second device) and a MOS monocrystalline Si thin film transistor (transferred device, first device) in different regions on an insulating substrate. As described in this embodiment, the semiconductor device is formed on an active-matrix substrate using TFT.

The MOS thin film transistor is a common transistor including an active semiconductor layer, an gate electrode, a gate insulating film, and dense impurity doped portions (source electrodes and drain electrodes) formed on the both sides of a gate, wherein the gate electrode adjusts the carrier density of the semiconductor layer beneath the gate, so as to adjust a flow of source-drain current.

Some of the characteristics of the MOS transistors when realized in a CMOS (Complementary MOS) structure include low power consumption and their ability to produce a full output according to a power voltage. The MOS transistors are therefore suitable as low-power-consuming logic devices.

As illustrated in FIG. 3(*i*), a semiconductor device 20 of the present embodiment includes a $SiO_2$ (silicon oxide) film (oxidized film) 3, a MOS polycrystalline Si thin film transistor (second device) 1*a* with a polycrystalline Si thin film 5', a MOS monocrystalline Si thin film transistor (first device) 16*a* with a monocrystalline Si thin film 14*a*, and metal leads 22, all of which are formed on an insulating substrate 2.

As the insulating substrate 2, the high-strain-point glass ("code 1737", a product of Corning) (alkali-earth alumino-boro-sillicated glass, thickness of about 0.7 mm) is used.

The $SiO_2$ film 3 is formed in a thickness of about 100 nm over the entire surface of the insulating substrate 2.

The MOS polycrystalline Si thin film transistor 1*a* with the polycrystalline Si thin film 5' has the polycrystalline Si thin film 5', a $SiO_2$ film 7, and a gate electrode 6 on a $SiO_2$ film 4 provided as an interlayer insulating film. The $SiO_2$ film 7 is provided as a gate insulating film.

The gate electrode 6, which is realized by a polysilicon film, may be realized by other materials such as polycrystalline Si or other kinds of silicides or polycides.

The MOS monocrystalline Si thin film transistor 16*a* with the monocrystalline Si thin film 14*a* includes a planarizing layer and a $SiO_2$ film 13, in addition to the monocrystalline Si thin film 14*a*. The planarizing layer has gate electrodes 12, and the $SiO_2$ film 13 is provided as a gate insulating film.

The monocrystalline Si thin film transistor 16*a* is partially formed on a monocrystalline Si substrate before it is bonded with the insulating substrate 2. The monocrystalline Si thin film transistor 16*a* is bonded with the insulating substrate 2 after the gate electrodes 12, a gate insulating film 13, the monocrystalline Si thin film 14*a*, and pre-defined regions for the source and drain have been formed thereon. Forming the gate electrode on the monocrystalline Si substrate and carrying out thereon ion implantation of impurities for the source and drain are more advantageous in the micro-fabrication of the monocrystalline Si thin film than forming the thin film transistor after the monocrystalline Si thin film is formed on the insulating substrate 2.

As described, the semiconductor device 20 of the present embodiment includes the MOS polycrystalline Si thin film transistor 1*a* and the MOS monocrystalline Si thin film transistor 16*a* together on a single substrate, i.e., the insulating substrate 2, thereby integrating circuits of different characteristics for improved performance and improved functionality. Further, a high-performance and multi-functional semiconductor device can be realized less expensively than forming all the transistors from the monocrystalline Si thin film alone on the insulating substrate 2.

It should be noted here that a distance of at least 0.3 μm or preferably at least 0.5 μm is provided between regions of the polycrystalline Si thin film 5' and the monocrystalline Si thin film 14*a*. This prevents the diffusion of metal atoms such as Ni, Pt, Sn, and Pd into the monocrystalline Si thin film 14*a*, and thereby stabilizes the characteristics of the monocrystalline Si thin film transistor 16*a*.

Further, by the provision of the $SiO_2$ film as an interlayer insulating film between the polycrystalline Si thin film transistor 1*a* and the monocrystalline Si thin film transistor 16*a* in the semiconductor device 20 of the present embodiment, the monocrystalline Si thin film 14*a* will not be contaminated.

For example, in the case of an active-matrix substrate for a liquid crystal display provided with the semiconductor device 20 of the present invention, the semiconductor device 20 is modified to accommodate the liquid crystal display by further including $SiN_x$ (silicon nitride), a planarizing resin film, a via hole, and a transparent electrode. In this case, the region of the polycrystalline Si thin film 5' is provided with drivers and TFTs for display, and the region of the monocrystalline Si thin film 14*a* has a timing controller to meet the requirements of the high-performance device. Note that, the driver section may be realized by monocrystalline silicon or other materials, depending on cost and performance.

By thus deciding the function and use of the thin film transistor according to the characteristics of the monocrystalline Si thin film 14*a* and the polycrystalline Si thin film 5' making up the thin film transistor, the performance and functionality of the thin film transistor can be improved.

Note that, compared with the mobility of about 100 $cm^2/V \cdot sec$ in an N-channel TFT formed in a region of a conventional polycrystalline Si thin film 5', the N-channel TFT formed in the region of the monocrystalline Si thin film 14*a* in an LCD active-matrix substrate provided with the semiconductor device of the present embodiment had a mobility of about 550 $cm^2/V \cdot sec$. Thus, with the configuration of the semiconductor device 20 of the present embodiment, the operation speed of the TFT can be increased.

Further, in the LCD active-matrix substrate, while the driver and the device formed in the region of the polycrystalline Si thin film 5' required a signal and power voltage of about of 7 V to 8 V, the timing controller, which is formed in the region of the monocrystalline Si thin film 14*a*, stably operated at 2.7 V.

Further, in the semiconductor device 20, because the integrated circuit is formed in each region of the polycrystalline Si thin film 5' and the monocrystalline Si thin film 14*a*, an integrated circuit with a pixel array can be formed in suitable regions according to a required structure and characteristic. The integrated circuits so formed in different regions can therefore have different operational speeds or operational power voltages. For example, the integrated circuits formed in different regions may be designed to differ from one another by at least one of the following criteria, including gate length, thickness of the gate insulating film, power voltage, and logic level.

As a result, a device is formed that has different characteristics in different regions, thereby realizing a semiconductor device with more functionality.

Further, in the semiconductor device 20, because the integrated circuit is formed in each region of the polycrystalline Si thin film 5' and the monocrystalline Si thin film 14a, the integrated circuits formed in these different regions can employ different processing rules. For example, when the channel length is short, while the absence of crystal boundary in the monocrystalline Si thin film region hardly causes variations in the TFT characteristics, the crystal boundary in the polycrystalline Si thin film region greatly increases such variations. This necessitates different processing rules in the respective regions. The present invention enables the integrated circuits to be suitably formed in these different regions according to required processing rules.

Further, in the semiconductor device 20 of the present embodiment, the metal lead pattern of the MOS monocrystalline Si thin film transistor 16a can be formed with a design rule that is less strict than that for the gate pattern.

This enables all of or part of the metal leads of the semiconductor device incorporating the MOS monocrystalline Si thin film transistor 16a to be processed simultaneously with the metal leads formed on a large substrate, thereby reducing cost and improving processability. In addition, interconnections with external leads, other circuit blocks, and TFT arrays become easier, thus reducing the percent yield of defective products caused by interconnection errors with an external device, etc.

It should be noted here that the size of the monocrystalline Si thin film 14a formed on the semiconductor device 20 is determined by the wafer size of the LSI manufacturing device. The wafer size of a common LSI manufacturing device is sufficient to satisfy various requirements of the monocrystalline Si thin film 14a, including speed, power consumption, high-speed logic, a timing generator, and a high-speed DAC (current buffer), which does not tolerate variations. The wafer size of a common LSI manufacturing device is also sufficient to form a processor, etc.

The following will describe a fabrication method of the semiconductor device 20.

In a fabrication method of the semiconductor device 20 of the present embodiment, the monocrystalline Si thin film transistor 16a is first fabricated on a monocrystalline Si substrate 10a, and then part of the monocrystalline Si thin film transistor 16a is transferred from the monocrystalline Si substrate 10a onto the insulating substrate 2.

Referring to FIG. 2(a) through FIG. 2(e), description is made below as to how the monocrystalline Si substrate 10a with the monocrystalline Si thin film transistor 16a is formed. The monocrystalline Si substrate 10a is formed by a common integrated circuit fabrication process with a process temperature of about 1000° C., using a monocrystalline silicon wafer 10, which measures 6 inches or 8 inches (a resistivity of about 10 Ωcm, and a thickness of about 0.7 mm). That is, with a micro-fabrication process for an integrated circuit of about 0.5 μm, the gate electrodes 12 are formed first.

First, the monocrystalline silicon wafer 10 is cleaned by a common cleaning method (RCA (SC1) cleaning, etc.), and the wafer surface is thermally oxidized in a thermal oxidation furnace (diffusion furnace) so as to form a gate insulating film 13, as shown in FIG. 2(a). Specifically, the gate insulating film 13 is formed in a thickness of 5 nm to 30 nm by carrying out HCl oxidation or pyrogenic oxidation at 1050° C. Next, as shown in FIG. 2(b), a polysilicon film to be the gate electrodes 12 is formed on the gate insulating film 13 by a thermal CVD method or other methods. Note that, the thermal CVD method deposits a silicon film by flowing monosilane gas onto a wafer under reduced pressures of 50 Pa to 200 Pa and at a temperature of about 600° C. As a result, a polysilicon film of 150 nm to 300 nm thick is formed. The resistance of the polysilicon film is then reduced by $n^+$ diffusion, etc.

Then, by photolithography, the polysilicon film so formed is patterned into the shape of the gate electrodes 12. Specifically, the gate electrodes 12 are formed by patterning the polysilicon film in the steps of applying, exposing, and developing a photoresist, followed by silicon etching and removal of the photoresist. Note that, because the gate electrodes 12 are processed in the IC·LSI process line, the gate electrodes 12 can have a line width as narrow as about 0.5 μm without difficulty.

In the next step, in order to form semiconductor source and drain regions, impurity ions are implanted. Specifically, after patterning the gate electrodes 12, impurity ions are implanted to self-align in regions to be the source and drain, as shown in FIG. 2(c). For N-type MOS, phosphor or arsenic is used. For P-type MOS, boron is used.

The impurity implantation damages the silicon crystal, and it does not reduce the resistance of the silicon to a sufficient level. A lower resistance is achieved by activation by way of a heat treatment of about 900° C. to about 1000° C. In some cases, an LDD (Lightly Doped Drain) is formed.

Then, as shown in FIG. 2(d), the interlayer insulating film 16 is formed by a thermal CVD method, etc. Since the interlayer insulating film 16 may be less dense than the gate insulating film 13, a $SiO_2$ film of about 300 nm to 400 nm thick is formed by flowing monosilane gas and oxygen gas under reduced pressures of about 100 Pa to 200 Pa and at a temperature of about 400° C. Then, by a CMP (chemical mechanical polishing) method, the interlayer insulating film 16 on the wafer surface is planarized. Here, the interlayer insulating film 16 is planarized to not more than 0.1 nm in a Ra value.

In the next step, as shown in FIG. 2(e), hydrogen ion implantation is carried out to form a hydrogen ion implanted portion 15. The implantation of hydrogen ion is carried out with an acceleration voltage of about 56 keV and a dose of about $1 \times 10^{16}/cm^2$ to about $5 \times 10^{16}/cm^2$. Note that, the acceleration voltage is suitably set so that a required thickness is obtained for the monocrystalline Si thin film 14a in a later step.

The monocrystalline silicon wafer (incomplete silicon wafer) with the transfer device is then cut into individual monocrystalline Si substrates 10a of a required size (not illustrated), so that the monocrystalline Si thin film transistor 16a can be transferred to the insulating substrate 2.

Referring to FIG. 3(a) through FIG. 3(i), description is made further as to how the semiconductor device 20 is fabricated.

After cleaning the insulating substrate 2 without disturbing its surface, the $SiO_2$ film 3 is formed in a thickness of about 100 nm by a plasma CVD method, as shown in FIG. 3(a). Specifically, a mixture gas of TEOS and $O_2$ is flown onto the entire surface of the insulating substrate 2 under reduced pressures of about 100 Pa to about 200 Pa and at a temperature of about 300° C., and the $SiO_2$ film 3 of about 100 nm thick is formed by plasma discharge. The $SiO_2$ film 3 ensures wettability on the surface of the insulating substrate 2, which may be made of glass.

Then, as shown in FIG. 3(b), after activating the insulating substrate 2 and individual pieces of the monocrystalline Si substrate 10a by SC-1 cleaning, the monocrystalline Si substrate 10a on the side of the hydrogen ion implanted portion 15 is aligned on a predetermined position so as to be bonded in contact with the insulating substrate 2 at room temperature.

The surface cleanness and activity of the insulating substrate 2 (light-transmissive amorphous substrate with the silicon oxide coating film) and the monocrystalline Si substrate 10a (transfer device substrate with the oxidized surface) become very important when these two substrates are to be bonded together without an adhesive. For this reason, the insulating substrate 2 and the monocrystalline Si substrate 10a are cleaned with a liquid called "SC1" and are dried before bonded.

The SC1 liquid is prepared by mixing commercially available ammonia water ($NH_4OH$: 30%), hydrogen peroxide water ($H_2O_2$: 30%), and pure water ($H_2O$). For example, a 5:12:60 mixture of these liquids is used. The temperature of the SC1 liquid may be room temperature. Cleaning is carried out by immersing the substrates in the SC1 liquid for 5 minutes. It is not preferable to immerse the substrates in the SC1 liquid for an extended time period, because the ammonia water slightly etches the surface of the silicon oxide layer (Ultra Clean ULSI Technique, Tadahiro Oomi, Baifukan Co., Ltd. p.172). The substrates are then cleaned with flown pure water (a resistivity of 10 MΩcm or greater) for 10 minutes, and are quickly dried with a spin drier, etc. After cleaning and drying, the insulating substrate 2 and the monocrystalline Si substrate 10a are brought into contact with each other and a slight force is applied. As a result, the two substrates attract each other and are bonded together, even though no adhesive is used.

The adhesive-less bonding of the monocrystalline Si substrate 10a and the insulating substrate 2 is realized by a combination of electric dipole and hydrogen bonding. The bonding of the two substrates is facilitated when these forces act on each other in similar proportions.

Figure 4:
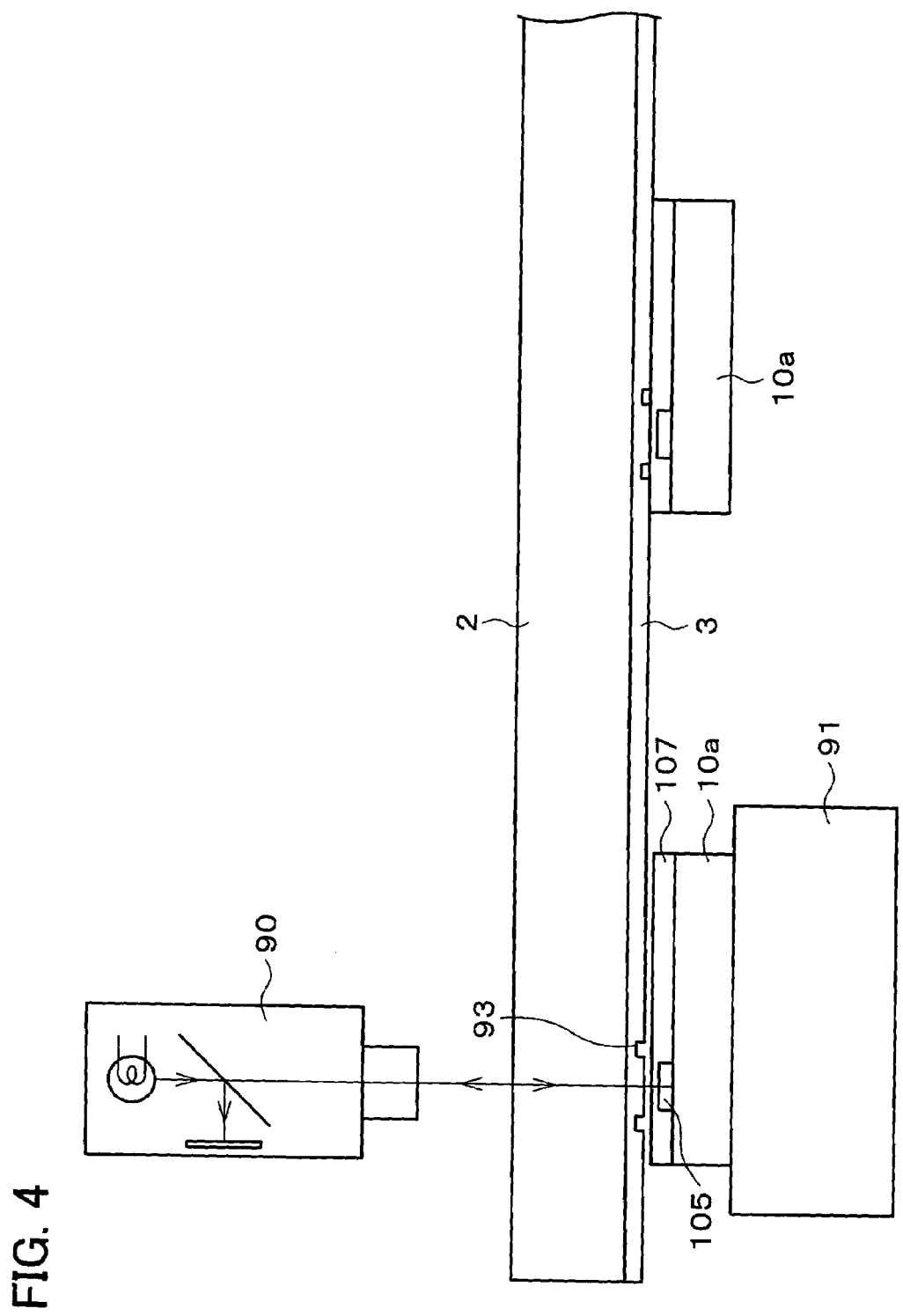
FIG. 4 is a cross sectional view illustrating an aligning step for a monocrystalline Si substrate and an insulating substrate in a fabrication method of a semiconductor device in one embodiment of the present invention.

Aligning of the monocrystalline Si substrate 10a and the insulating substrate 2 during assembly is carried out as follows. As shown in FIG. 4, visible light is shone through the insulating substrate 2 (the Corning product 1737 glass in this example) to detect an alignment mark 94 on the monocrystalline Si substrate 10a and an alignment mark 93 on the insulating substrate 2. In the example of FIG. 4, the epi-illumination from an aligning CCD camera 90 set in a microscope detects the alignment mark 94 on the monocrystalline Si substrate 10a mounted on an alignment stage 91, and the result of detection is converted into an electrical signal for processing.

In a conventional method in which alignment is carried out by irradiation of infra red ray through the Si substrate, an IC, etc. is used to detect the alignment mark through a Si wafer that is non-transparent to visible light and ultra violet light and that scatters light at the surface which is not planarized to prevent absorption of light. Therefore, the accuracy is inevitably poor.

In contrast, in the semiconductor device of the present embodiment, the alignment marks 93 and 94 are detected through glass that is transparent to ultra violet light and visible light of a shorter wavelength range and which does not scatter light on the surface, for example. This allows for more accurate alignment than the conventional method.

In the next step, as shown in FIG. 3(c), the second $SiO_2$ film 4 is deposited in a thickness of about 200 nm over the entire surface of the insulating substrate 2. Here, the film is deposited by plasma discharge by flowing TEOS gas and oxygen gas under reduced pressures of about 100 Pa to about 200 Pa and at a temperature of about 300° C.

Then, the amorphous Si thin film (amorphous Si film) 5 is deposited in a thickness of about 50 nm over the entire surface of the $SiO_2$ film 4. Here, the film is deposited by plasma discharge by flowing monosilane gas and hydrogen gas at a temperature of about 250° C.

Next, the temperature of the hydrogen ion implanted portion 15 is increased above the temperature at which the hydrogen is released from the monocrystalline Si substrate 10a (400° C. to 600° C., about 550° C. in this example). This cleaves an unwanted portion 11 of the monocrystalline Si substrate 10 along the hydrogen ion implanted portion 15, as shown in FIG. 3(d).

Here, the heat treatment initiates the reaction Si—OH+Si—OH→Si—O—Si+$H_2O$ at the interface of the monocrystalline Si substrate 10a and the insulating substrate 2 held together by the force of hydrogen bonding, thereby bonding the substrates by the stronger force of atomic bonding.

The monocrystalline Si thin film transistor 16a is held on the insulating substrate 2 via the inorganic insulating film 3. This ensures that the monocrystalline Si thin film 14a will not be contaminated as compared with the conventional bonding with an adhesive.

In the next step, unwanted portions of the monocrystalline Si thin film 14a that were not detached from the insulating substrate 2 are etched away to form discrete portions of monocrystalline Si. The damaged layer that appears on the surface is removed by light-etching the layer to about 10 nm by isotropic plasma etching or wet etching. In this example, wet etching is carried out using a buffered hydrofluoric acid. As a result, the monocrystalline Si thin film 14a is formed in a thickness of about 50 nm on the insulating substrate 2, defining portions of the MOSFET.

Next, as shown in FIG. 3(e), by irradiation of an excimer laser, the amorphous Si thin film 5 is heated and crystallized to grow a polycrystalline Si layer and thereby form the polycrystalline Si thin film 5'. Namely, the deposited semiconductor film (amorphous Si thin film 5) is modified from an amorphous to polycrystalline state by the polycrystallization using a laser beam (energy beam), so as to form the polycrystalline Si thin film 5'.

The regions of the monocrystalline Si thin film 14a and the amorphous Si thin film 5 coexist on the insulating film 2. It is therefore required that the irradiation of the excimer laser not be carried out in the region of the monocrystalline Si thin film 14a, in order to present damage therein.

For this reason, an SLS (Sequential Lateral solidification) method is used to irradiate the excimer laser except for the region of the monocrystalline Si thin film 14a, as shown in FIG. 1.

The SLS method is a polycrystallization method which uses a pulse laser such as an excimer laser as a laser beam. The SLS method also uses an optical mask inserted in the optical path of the laser beam, wherein the optical mask may or may not be inserted in a given shot. The method, with its irradiation program, is able to mask the region of the transfer device and irradiate the laser beam only on the amorphous Si thin film 5.

Note that, the method of laser irradiation is not just limited to the SLS method. Any method may be used as long as a mask can be inserted in the optical path of the laser to partly turn "ON" or "OFF" the laser beam. For example, a laser irradiation device may be used that includes an optical mask or the like means for selectively allowing or disallowing passage of part of an emitted rectangular beam. Alternatively, a mask may be inserted above the substrate irradiated with the laser beam, or between the laser irradiation device and the substrate.

Further, the region where the irradiation of the laser beam is blocked is not just limited to the region of the monocrystalline Si thin film 14a. The laser beam may be blocked in any region where it does not need to be modified to the polycrystalline Si thin film.

Then, as shown in FIG. 3(f), in order to provide portions for the active region of the device, unwanted portions of the polycrystalline Si film 5' are removed to obtain a discrete pattern in the polycrystalline Si film 5'. The pattern of the polycrystalline Si film 5' becomes the semiconductor layer of the polycrystalline Si thin film transistor 1a.

Next, using a mixture of TEOS gas and oxygen gas, a $SiO_2$ film of about 350 nm thick is deposited by plasma CVD, and the film is etched back to about 400 nm by RIE, which is anisotropic etching. Then, as the gate insulating film of the polycrystalline thin film transistor 1a, the $SiO_2$ film 7 is formed in a thickness of about 60 nm by plasma CVD, using a mixture of $SiH_4$ gas and $N_2O$ gas. Here, side walls are formed at the end portions of the respective patterns of the monocrystalline Si thin film 14a and the polycrystalline Si thin film 5'. The $SiO_2$ film 7 becomes the interlayer insulating film of the polycrystalline Si thin film transistor 1a.

A polysilicon film to be the gate electrode 6 of the polycrystalline Si thin film transistor 1a is formed on the $SiO_2$ film 7 by a thermal CVD method, etc. Note that, the thermal CVD method is a method in which a silicon film is deposited by flowing monosilane gas onto a wafer under reduced pressures of 50 Pa to 200 Pa and at a temperature of about 600° C. The method forms a polysilicon film of about 150 nm to 300 nm thick. Note that, when depositing the silicon film, it is preferable that a minute amount of diborane gas be added to the silane gas in advance and form doped polysilicon, and that the pulse laser be irradiated transiently (as in SLS method) to achieve low resistance. Further, the gate electrode 6 is not just limited to the polysilicon film, and may be formed by depositing and patterning a high-melting-point metal such as tungsten (W).

In the next step, by photolithography, the polysilicon film so formed is patterned into the shape of the gate electrode 6. Specifically, the gate electrode 6 is formed by patterning the polysilicon film in the steps of applying, exposing, and developing a photoresist, followed by silicon etching and removal of the photoresist.

Then, as shown in FIG. 3(g), the $SiO_2$ film 8 of about 350 nm thick is formed as an interlayer planarizing insulating film by P-CVD, using a mixture of TEOS gas and $O_2$ gas.

Next, a contact hole 21 is formed as shown in FIG. 3(h), and the metal (AlSi) lead 22 is formed therein as shown in FIG. 3(i).

As described, in the fabrication method of a semiconductor device according to the present embodiment, the laser beam that is irradiated to modify the amorphous Si thin film 5 into the polycrystalline Si film 5' is partly blocked by the mask inserted in part of the optical path of the laser beam.

This enables only the region of the amorphous Si thin film 5 to be irradiated with the laser beam, and the laser beam will not irradiate the region of the monocrystalline Si thin film transistor 16a transferred onto the insulating film 2. In this way, the monocrystalline Si thin film transistor 16a will not be damaged by the laser beam.

The present embodiment described the case where the mask is inserted in part of the optical path of the laser beam to prevent the laser beam from irradiating the region of the monocrystalline Si thin film transistor 16a. However, the present invention is not just limited to this implementation. For example, the laser output may be turned OFF when the laser beam scan the region of the monocrystalline Si thin film transistor 16a, and may be turned ON when scanning a region to be irradiated with the laser beam.

A drawback of the frequent ON/OFF of the laser output, however, is that it may introduce instability to the laser output. It is therefore more preferable, in terms of output stability, that the irradiation of the laser beam be selectively carried out by inserting the mask in the optical path of the laser beam, because it ensures continuous laser output.

Further, in the present embodiment, the monocrystalline Si thin film transistor 16a is bonded with the insulating substrate 2 before the polycrystalline Si thin film 5' is formed on the insulating substrate 2. This enables the monocrystalline Si substrate 10a to be bonded with the flat surface of the insulating substrate 2, before the surface of the insulating substrate 2 is damaged by the laser beam. As a result, the problem of interconnection error, etc. is prevented.

In the present embodiment, the irradiation of the laser beam is carried out after the monocrystalline Si substrate 10a is bonded to the insulating substrate 2, and after (unwanted) portions of the monocrystalline Si substrate 10a have been detached. However, the timing of laser beam irradiation is not limited to this. For example, the laser beam may be irradiated after the monocrystalline Si substrate 10a is bonded to the insulating substrate 2, and before (unwanted) portions of the monocrystalline Si substrate 10a are detached from the hydrogen ion implanted portion.

Further, the foregoing described the case where the monocrystalline Si substrate 10a with the implanted hydrogen ions is bonded to the insulating substrate 2, and unwanted portions of the monocrystalline Si substrate 10 is cleaved along the hydrogen ion implanted portion by a heat treatment. However, the present invention is not just limited to this implementation, and any method may be used as long as the unwanted portions of the monocrystalline Si substrate 10a are detached.

Further, the present embodiment described blocking only the laser beam that irradiates the region of the monocrystalline Si thin film transistor 16a. However, the present invention is not just limited to this implementation. For example, the laser beam may irradiate only portions of the amorphous Si thin film 5 remaining as the polycrystalline Si thin film 5' of the polycrystalline Si thin film transistor 1a.

Note that, as described in the present embodiment, the first device transferred on the insulating substrate 2 is a monocrystalline Si thin film transistor. However, the present invention is not just limited to this and may employ other kinds of transistors as long as they can be formed on the insulating substrate 2 by the foregoing transfer process.

Second Embodiment

Another embodiment of the present invention is described below with reference to the attached drawings. Note that, for convenience of explanation, members having the same functions are those described in conjunction with the semiconductor device of the foregoing First Embodiment are given the same reference numerals and detailed explanation thereof is omitted here.

As in the semiconductor device of the First Embodiment, a semiconductor device of the present embodiment provides improved performance and improved functionality by forming a MOS polycrystalline Si thin film transistor (deposited device, second device) and a MOS monocrystalline Si thin film transistor (transferred device, first device) in different regions on an insulating substrate. As described in this embodiment, the semiconductor device is formed on an active-matrix substrate using TFT.

As illustrated in FIG. 5(g), a semiconductor device 20 of the present embodiment includes a MOS polycrystalline (non-monocrystalline) Si thin film transistor (second device) 1a with a polycrystalline (non-monocrystalline) Si thin film 5', a MOS monocrystalline Si thin film transistor (first device) 16a with a monocrystalline Si thin film 14a, and metal leads 22, all of which are formed on an insulating substrate 2.

As the insulating substrate 2, the high-strain-point glass ("code 1737", a product of Corning) (alkali-earth alumino-boro-sillicated glass, thickness of about 0.7 mm) is used. However, the insulating substrate 2 is not just limited to this example, and may be a light-transmissive amorphous substrate such as a high-strain-point glass, for example.

The $SiO_2$ film 3 is formed in a thickness of about 100 nm over the entire surface of the insulating substrate 2.

The MOS polycrystalline Si thin film transistor 1a with the polycrystalline Si thin film 5' has the polycrystalline Si thin film 5', a $SiO_2$ film 7, and a gate electrode 6 on a $SiO_2$ film 4 provided as an interlayer insulating film. The $SiO_2$ film 7 is provided as a gate insulating film.

The gate electrode 6, which is realized by a polysilicon film, may be realized by other materials such as polycrystalline Si or other kinds of suicides or polycides.

The MOS monocrystalline Si thin film transistor 16a with the monocrystalline Si thin film 14a includes a planarizing layer and a $SiO_2$ film 13, in addition to the monocrystalline Si thin film 14a. The planarizing layer has gate electrodes 12, and the $SiO_2$ film 13 is provided as a gate insulating film.

A main portion of the monocrystalline Si thin film transistor 16a is formed on a monocrystalline Si substrate 10a before it is bonded with the insulating substrate 2. That is, the monocrystalline Si substrate 10a is bonded with the insulating substrate 2 after the gate electrodes 12, a gate insulating film 13, the monocrystalline Si thin film 14a, a source-drain impurity implanted region (not shown), and an interlayer insulating film 16 have been formed on the monocrystalline Si substrate 10a, and after the surface of the monocrystalline Si substrate 10a has been planarized and hydrogen ions have been implanted therein. Forming the gate electrode on the monocrystalline Si substrate 10a and carrying out thereon ion implantation of impurities for the source and drain are more advantageous in the microfabrication of the monocrystalline Si thin film than forming the thin film transistor after the monocrystalline Si thin film is formed on the insulating substrate 2.

As described, the semiconductor device 20 of the present embodiment includes the MOS polycrystalline Si thin film transistor 1a and the MOS monocrystalline Si thin film transistor 16a (monolithically) formed on a single substrate, i.e., the insulating substrate 2, thereby integrating circuits of different characteristics for improved performance and improved functionality. Further, a high-performance and multi-functional semiconductor device can be realized less expensively than forming all the transistors from the monocrystalline Si thin film alone on the insulating substrate 2.

For example, in the case of an active-matrix substrate for a liquid crystal display provided with the semiconductor device 20 of the present invention, the semiconductor device 20 is modified to accommodate the liquid crystal display by further including $SiN_x$ (silicon nitride), a planarizing resin film, a via hole, and a transparent electrode. In this case, the region of the polycrystalline Si thin film 5' is provided with drivers and TFTs for display, and the region of the monocrystalline Si thin film 14a has a timing controller to meet the requirements of the high-performance device.

By thus deciding the function and use of the thin film transistor according to the characteristics of the monocrystalline Si thin film 14a and the polycrystalline Si thin film 5' making up the thin film transistor, the performance and functionality of the thin film transistor can be improved.

Further, in the semiconductor device 20, because the integrated circuit is formed in each region of the polycrystalline Si thin film 5' and the monocrystalline Si thin film 14a, an integrated circuit with a pixel array can be formed in suitable regions according to a required structure and characteristic. The integrated circuits so formed in different regions can therefore have different operational speeds or operational power voltages. For example, the integrated circuits formed in different regions may be designed to differ from one another by at least one of the following criteria, including gate length, thickness of the gate insulating film, power voltage, and logic level.

As a result, a device is formed that has different characteristics in different regions, thereby realizing a semiconductor device with more functionality.

The following will describe a fabrication method of the semiconductor device 20.

In a fabrication method of the semiconductor device 20 of the present embodiment, the monocrystalline Si thin film transistor 16a is first fabricated on a monocrystalline Si substrate 10a, and then part of the monocrystalline Si thin film transistor 16a is transferred from the monocrystalline Si substrate 10a onto the insulating substrate 2.

As to the fabrication method of the monocrystalline Si substrate (transfer substrate) 10a that incorporates the monocrystalline Si thin film transistor 16a, no further explanation is given since it was already described in the First Embodiment with reference to FIG. 2(a) through FIG. 2(e).

Referring to FIG. 5(a) through FIG. 5(i), description is made below as to the fabrication method of the semiconductor device 20.

After cleaning the insulating substrate 2 without disturbing its surface, the $SiO_2$ film 3 is formed in a thickness of about 100 nm by a plasma CVD method, as shown in FIG. 5(a). Specifically, a mixture gas of TEOS and $O_2$ is flown onto the entire surface of the insulating substrate 2 under reduced pressures of about 100 Pa to about 200 Pa and at a temperature of about 300° C., and the $SiO_2$ film 3 of about 100 nm thick is formed by plasma discharge. The $SiO_2$ film 3 ensures wettability on the surface of the insulating substrate 2, which may be made of glass.

Then, as shown in FIG. 5(b), after activating the insulating substrate 2 and individual pieces of the monocrystalline Si substrate 10a by SC-1 cleaning, the monocrystalline Si substrate 10a on the side of the hydrogen ion implanted portion 15 is aligned on a predetermined position so as to be bonded in contact with the insulating substrate 2 at room temperature (bonding step).

The surface cleanness and activity of the insulating substrate 2 (light-transmissive amorphous substrate with the silicon oxide coating film) and the monocrystalline Si substrate 10a (transfer device substrate with the oxidized surface) become very important when these two substrates are to be bonded together without an adhesive. For this reason, the insulating substrate 2 and the monocrystalline Si substrate 10a are cleaned with a liquid called "SC1" and are dried before bonded.

Next, as shown in FIG. 5(c), the $SiO_2$ film 4 and the amorphous (non-monocrystalline) Si film 5 are formed by a catalytic CVD method over the insulating film 2 and the monocrystalline Si substrate 10a (amorphous Si forming step).

The amorphous Si film 5, as deposited by the catalytic CVD method, has a low hydrogen content of not more than $1\times10^{19}$ cm$^{-3}$ (before subjected to a heat treatment). With a hydrogen content of not more than $1\times10^{19}$ cm$^{-3}$, a dehydrogenating annealing process, which exposes the amorphous Si film 5 to a temperature of 450° C. or greater before laser crystallization, becomes unnecessary.

Figure 6:
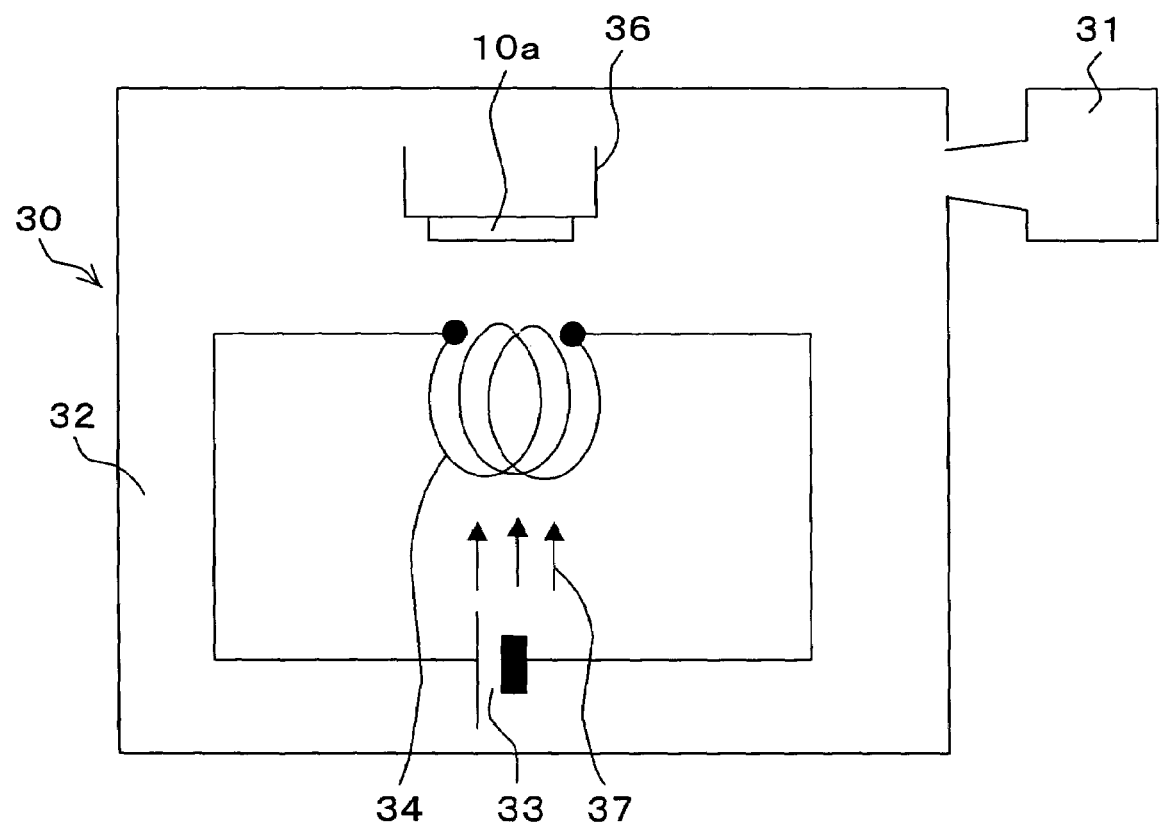
FIG. 6 is a diagram schematically showing a catalytic CVD device.

FIG. 6 is a schematic view showing a structure of the catalytic CVD device 30 taught in IDW (International Display Workshop) 1998, p.120. In the present embodiment, the catalytic CVD device 30 is used to form the SiO$_2$ film 4 and the amorphous Si film 5 by the catalytic CVD method. However, the present invention is not limited to this device, and other devices may be used as well.

The catalytic CVD device 30 is structured to include a vacuum chamber 32 with a vacuum pump 31. The catalytic CVD device 30 also includes a tungsten wire (catalyst, catalyzer) 34 across which a voltage is applied by a power source 33, and a substrate heater 36 for holding the monocrystalline Si substrate 10a, wherein the tungsten wire 34 and the substrate heater 36 are disposed in the vacuum chamber 32.

A current is flown through the tungsten wire 34 to temperatures of about 1800° C. to 2000° C. Through the tungsten wire 34, monosilane gas 37 as a material gas is flown to the monocrystalline Si substrate 10a. This heats the surface of the monocrystalline Si substrate 10a to about 200° C. to 300° C., and forms the amorphous Si film 5.

By thus depositing the amorphous Si film 5 by the catalytic CVD method, the hydrogen content of the amorphous Si film 5 does not exceed $1\times10^{19}$ cm$^{-3}$. This is made possible by the catalytic action of the tungsten wire 34 which promotes decomposition of the monosilane gas 37 as it passes through the sides of the tungsten wire 34 under heat. Note that, the hydrogen content of not more than $1\times10^{19}$ cm$^{-3}$ may be confirmed by evaluating the absorption at 2000 cm$^{-1}$ in the measurement of transmittance using a Fourier conversion IR spectrometer, and by TDS (Temperature Desorption Spectroscopy).

Note that, during the deposition of the SiO$_2$ film 4 and the amorphous Si film 5 by the catalytic CVD method, the monocrystalline Si substrate 10a remains bonded to the insulating substrate 2 without detaching from it. This is because the surface of the monocrystalline Si substrate 10a is heated to only 200° C. to 300° C., which is not high enough to release the hydrogen from the monocrystalline Si substrate 10a.

Next, as shown in FIG. 5(c), an energy beam is irradiated on the amorphous Si film 5 to heat and melt the amorphous Si film 5 and thereby modify it to the polycrystalline Si film 5' (modifying step). In the present embodiment, the energy beam used for the irradiation is an excimer laser with a wavelength in a near UV range, with its beam intensity distribution shaped into a rectangular wave.

Here, the monocrystalline Si substrate 10a carries a silicon piece (unnecessary portion, chip, part of the transfer substrate) 11 with a bulk level thickness of about 0.7 mm. The silicon piece 11 of about 0.7 mm thick thus serves as a heat sink when the region of the monocrystalline Si substrate 10a is irradiated with the excimer laser to modify the amorphous Si film 5 into polycrystal. The silicon piece 11 thus protects the crystallinity of the monocrystalline Si thin film 14a from heat.

Next, a detaching step is carried out to detach the silicon piece 11 of the monocrystalline Si substrate 10a by a heat treatment. Specifically, the temperature of the hydrogen ion implanted portion 15 is raised to about 600° C., at or above which the hydrogen is released from the monocrystalline Si substrate 10a. As a result, the silicon piece 11 of the monocrystalline Si substrate 10a bonded to the insulating substrate 2 is cleaved along the hydrogen ion implanted portion 15, as shown in FIG. 5(d).

Here, the heat treatment initiates the reaction Si—OH+—Si—OH→Si—O—Si+H$_2$O at the interface of the monocrystalline Si substrate 10a and the insulating substrate 2 held together by the Van der Waals force or hydrogen bonding, thereby bonding the substrates by the stronger force of atomic bonding. The monocrystalline Si thin film transistor 16a is bonded with the insulating substrate 2 via the inorganic insulating film 3. This ensures that the monocrystalline Si thin film 14a will not be contaminated as compared with the conventional bonding with an adhesive.

In the next step, unwanted portions of the monocrystalline Si thin film 14a that were not detached from the insulating substrate 2 are etched away to form discrete portions of monocrystalline Si. The damaged layer that appears on the surface is removed by light-etching the layer to about 10 nm by isotropic plasma etching or wet etching. In this example, wet etching is carried out using hydrofluoric acid as a buffer. As a result, the monocrystalline Si thin film 14a is formed in a thickness of about 50 nm on the insulating substrate 2, defining portions of the MOSFET.

Then, as shown in FIG. 5(e), in order to provide portions for the active region of the device, unwanted portions of the polycrystalline Si film 5' are removed to obtain a discrete pattern in the polycrystalline Si film 5'. The pattern of the polycrystalline Si film 5' becomes the semiconductor layer of the polycrystalline Si thin film transistor 1a.

Next, using a mixture of TEOS gas and oxygen gas, a SiO$_2$ film of about 350 nm thick is deposited by plasma CVD, and the film is etched back to about 400 nm by RIE, which is anisotropic etching. Then, as the gate insulating film of the polycrystalline thin film transistor 1a, the SiO$_2$ film 7 is formed in a thickness of about 60 nm by plasma CVD, using a mixture of SiH$_4$ gas and N$_2$O gas.

Next, as shown in FIG. 5(f), the gate electrode 6 of the polycrystalline Si thin film transistor 1a is formed on the SiO$_2$ film 7. In the present embodiment, a polysilicon film to be the gate electrode 6 of the polycrystalline Si thin film transistor 1a is formed on the SiO$_2$ film 7 by a thermal CVD method, etc. Note that, the thermal CVD method is a method in which a silicon film is deposited by flowing monosilane gas onto a wafer under reduced pressures of 50 Pa to 200 Pa and at a temperature of about 600° C. The method forms a polysilicon film of about 150 nm to 300 nm thick. The polysilicon film so formed is patterned into the shape of the gate electrode 6 by photolithography. Specifically, the gate electrode 6 is formed by patterning the polysilicon film in the steps of applying, exposing, and developing a photoresist, followed by silicon etching and removal of the photoresist. Note that, when depositing the silicon film, it is preferable that a minute amount of diborane gas be added to the silane gas in advance and form doped polysilicon, and that the pulse laser be irradiated transiently (as in SLS method) to achieve low resistance. Further, the gate electrode 6 is not just limited to the polysilicon film, and may be formed by depositing and patterning a high-melting-point metal such as tungsten (W).

Then, the polycrystalline Si film 5' is doped with source-drain impurities by an ion doping method, and the impurities are activated. Further, the SiO$_2$ film 8 of about 350 nm thick is formed as an interlayer planarizing insulating film by P-CVD, using a mixture of TEOS gas and O$_2$ gas.

Next, the SiO$_2$ film 8 at the interface of the monocrystalline Si thin film transistor and the polycrystalline Si thin film transistor is planarized, so that wire breakage does not occur when a metallization film to be metal leads is deposited at the interface.

Figure 5:
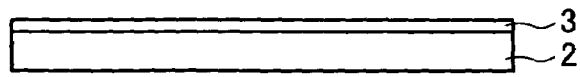
FIG. 5(a) through FIG. 5(g) are cross sectional views showing fabrication steps of a semiconductor device in another embodiment of the present invention.
Figure 5:
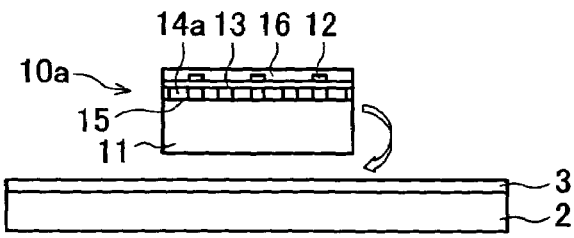
Figure 5:
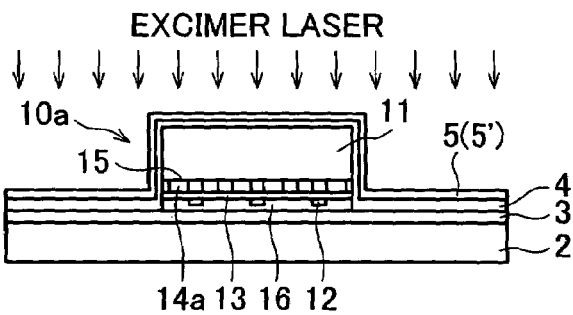
Figure 5:
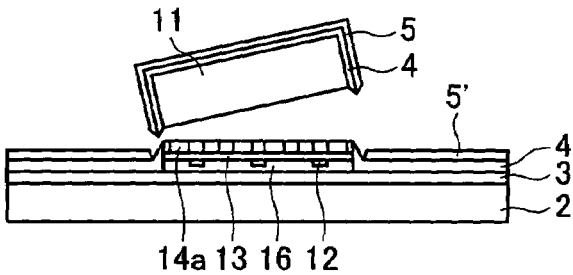
Figure 5:
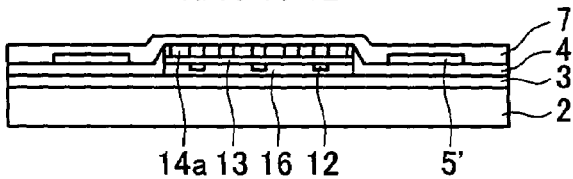
Figure 5:
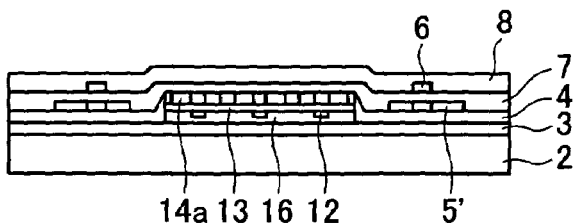
Figure 5:
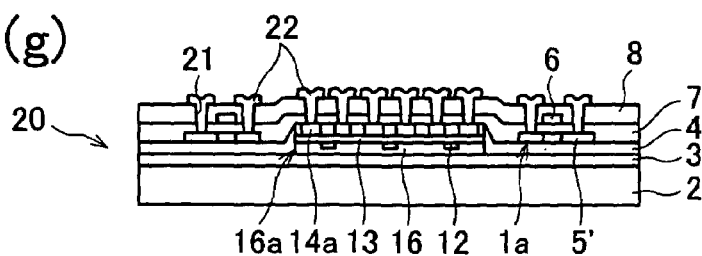

In the next step, as shown in FIG. 5(*g*), a contact hole 21 is formed, and a source-drain metallization film (metallization (AlSi) lead) 22 is deposited and patterned.

As described, in the semiconductor device 20 of the present embodiment, the amorphous Si thin film 5 is formed by the catalytic CVD method. This enables the hydrogen content of the amorphous Si thin film 5 to be reduced to the level (not more than $1\times10^{19}$ cm$^{-3}$) where a dehydrogenating annealing process, which is carried out before the irradiation of the excimer laser, is no longer required. By not requiring the dehydrogenating annealing process, the irradiation of the excimer laser to modify the amorphous Si thin film 5 to the polycrystalline Si thin film 5' can be carried out after the monocrystalline Si substrate 10*a* is bonded to the insulating substrate 2 and before the silicon piece 11 is cleaved along the hydrogen ion implanted portion 15. In the event where the dehydrogenating annealing process is carried out, the insulating substrate 2 with the monocrystalline Si substrate 10*a* bonded thereto is subjected to temperatures of 450° C. or greater, with the result that the silicon piece 11 is cleaved along the hydrogen ion implanted portion 15.

On the other hand, by carrying out the irradiation of the excimer laser with the silicon piece 11 bonded to the monocrystalline Si substrate 10*a*, the silicon piece 11 with its large heat capacity serves as a heat sink for the irradiated excimer laser. This prevents the monocrystalline Si thin film 14*a* from being damaged by the heat of the irradiated excimer laser. In other words, the monocrystalline Si thin film 14*a* will not be damaged by the polycrystallization process using the excimer laser. This enables the monocrystalline Si thin film transistor 16*a* and the polycrystalline Si thin film transistor 1*a* to be monolithically mounted on the insulating substrate 2 by maintaining their characteristics (i.e., without losing the characteristics of the respective transistors that would have been obtained when they were fabricated separately).

By thus mounting on the insulating substrate 2 the two kinds of high-performance silicon devices respectively made from the monocrystalline Si thin film and polycrystalline Si thin film, and by utilizing the advantages of the respective devices, a semiconductor device or display device can be realized with the added value.

Further, because the dehydrogenating annealing process is not required, the fabrication steps required for the dehydrogenating annealing process can be omitted, thereby reducing manufacturing cost.

Further, because the monocrystalline Si substrate 10*a* with the monocrystalline Si thin film transistor 16*a* can be bonded to the flat surface of the insulating substrate 2 before the surface of the insulating substrate 2 is damaged by the irradiation of the excimer laser, the problem of interconnection error, etc. can be prevented.

Further, in fabricating the devices, the fabrication process (fabrication steps) for the monocrystalline Si thin film transistor 16*a* and that for the polycrystalline Si thin film transistor 1*a* can be carried out in conformity even after the monocrystalline Si substrate 10*a* is bonded to the insulating substrate 2. More specifically, the processes for forming the insulating film, contact hole, or electrode metal on the monocrystalline Si thin film transistor 16*a* can be carried out together with the corresponding processes for the polycrystalline Si thin film transistor 1*a*. This improves the efficiency of each fabrication step and thereby reduces manufacturing cost.

In addition, interconnections with external leads, other circuit blocks, and TFT arrays become easier, thus reducing the percent yield of defective products caused by interconnection errors with an external device, etc.

Further, in the present embodiment, the amorphous Si thin film 5 is deposited using the catalytic CVD method, in order to achieve the hydrogen content of not more than $1\times10^{19}$ cm$^{-3}$ in the amorphous Si film 5. However, the deposition method of the amorphous Si film 5 is not just limited to the catalytic CVD method, and any method may be used as long as the hydrogen content of not more than $1\times10^{19}$ cm$^{-3}$ is obtained.

Further, as described in the present embodiment, the transistor transferred on the insulating substrate 2 is a monocrystalline Si thin film transistor 16*a*. However, the present invention is not just limited to this and may employ other kinds of transistors.

Further, in the present embodiment, the monocrystalline Si substrate 10*a* is bonded with the insulating substrate 2 after the gate electrodes 12, a gate insulating film 13, the monocrystalline Si thin film 14*a*, a source-drain impurity implanted region (not shown), and an interlayer insulating film 16 have been formed on the monocrystalline Si substrate 10*a*, and after the surface of the monocrystalline Si substrate 10*a* has been planarized and hydrogen ions have been implanted therein. Forming the gate electrode on the monocrystalline Si substrate 10*a* and carrying out thereon ion implantation of impurities for the source and drain are more advantageous in the micro-fabrication of the monocrystalline Si thin film than forming the thin film transistor after the monocrystalline Si thin film is formed on the insulating substrate 2.

Note that, the monocrystalline Si substrate 10*a* is only required to be bonded with the insulating substrate 2 with its main portion fabricated on the monocrystalline Si thin film transistor 16*a*, and it is not necessarily required to bond the monocrystalline Si substrate 10*a* with the insulating substrate 2*a* after the gate electrodes 12, a gate insulating film 13, the monocrystalline Si thin film 14*a*, a source-drain impurity implanted region (not shown), and an interlayer insulating film 16 have been formed on the monocrystalline Si substrate 10*a*, and after the surface of the monocrystalline Si substrate 10*a* has been planarized and hydrogen ions have been implanted therein.

Further, in the present embodiment, high-strain-point glass is used as the insulating substrate 2, and the polycrystalline Si thin film transistor 1*a* is deposited on the insulating substrate 2. However, the present invention is not limited to this implementation. For example, a high-temperature polycrystalline Si thin film transistor may be formed on a quartz substrate.

Further, as described in this embodiment, the semiconductor device is formed on the active-matrix substrate using TFT. However, the present invention is not limited to this implementation.

In order to solve the foregoing problems, the present invention provides a fabrication method of a semiconductor device in which a first device and a second device are both formed on an insulating substrate wherein the first device is formed on the insulating substrate with its main portion transferred thereon, and the second device is formed on the insulating substrate by being deposited thereon. The method includes the step of forming the second device after the main portion of the first device is transferred on the insulating substrate, and the step of forming the second device includes the steps of: forming an amorphous Si thin film on the insulating substrate; and modifying the amorphous Si thin film to a polycrystalline Si thin film by irradiation of an energy beam, the energy beam being irradiated except for the main portion of the first device.

The method prevents the first device from being damaged by the energy beam irradiated to form the polycrystalline Si thin film in the semiconductor device in which the monocrystalline Si thin film transistor, which has been transferred, and the polycrystalline Si thin film transistor, which has been formed on the insulating substrate, are formed on the insulating substrate.

Further, the method allows the substrate with the first device to be bonded with the flat surface of the insulating substrate before the surface of the insulating substrate 2 is damaged by the laser beam. As a result, the problem of interconnection error, etc. is prevented.

In the fabrication method of a semiconductor device according to the present invention, a mask may be inserted in an optical path of the energy beam so as to enable the energy beam to be irradiated except for the main portion of the first device.

The method allows for selective irradiation of the beam for the semiconductor device by inserting or not inserting the mask. The method therefore enables the energy beam to be irradiated except for the region of the first device, without causing instability in the output of the energy beam.

The fabrication method of a semiconductor device according to the present invention may be adapted so that the step of forming the first device further includes the steps of: bonding the insulating substrate with a transfer substrate on which the main portion of the first device has been formed; and detaching an unnecessary portion of the transfer substrate, wherein the step of modifying the amorphous Si thin film is carried out after the step of detaching an unnecessary portion of the transfer substrate.

The method enables a complicated micro fabrication process to be carried out on the transfer substrate before it is transferred to the insulating substrate. This is easier than carrying out such a process after the first device is formed on the insulating substrate. Further, the method enables unnecessary portions of the substrate bonded with the insulating substrate to be detached without being affected by the irradiated energy beam.

The fabrication method of a semiconductor device according to the present invention may be adapted so that the step of forming the first device further includes the steps of: bonding the insulating substrate with a transfer substrate on which the main portion of the first device has been formed; and detaching an unnecessary portion of the transfer substrate, wherein the step of modifying the amorphous Si thin film is carried out after the step of bonding the insulating substrate with a transfer substrate, and before the step of detaching an unnecessary portion of the transfer substrate.

In this case, for example, the step of forming the first device may be carried out first by the step of bonding the insulating substrate with the transfer substrate on which a main portion of the first device has been formed and in which hydrogen ions have been implanted, and then by the step of detaching unnecessary portions of the transfer substrate by a heat treatment, wherein the catalytic CVD method is used to form the amorphous Si thin film.

The method enables the hydrogen content of the amorphous Si thin film to be reduced to the level where the dehydrogenating annealing process, which is carried out at temperatures that detach the unnecessary portions of the transfer substrate, is no longer required.

Thus, during the irradiation of the energy beam in the modifying step, the unnecessary portions of the transfer substrate before they are detached in the later detaching step serve as a heat sink and prevent the first device from being damaged by the heat of the irradiated energy beam. This enables the first device and second device to be monolithically mounted on the insulating substrate by maintaining their characteristics.

Further, because the dehydrogenating annealing process is not required, the number of fabrication steps can be reduced, thereby reducing manufacturing cost.

Further, the method allows the transfer substrate with the first device to be bonded with the flat surface of the insulating substrate before the surface of the insulating substrate is damaged by the irradiated energy beam. As a result, the problem of interconnection error, etc. is prevented.

Further, the fabrication process for the first device and that for the second device can be carried out in conformity after the transfer substrate is bonded to the insulating substrate. More specifically, the processes for forming the insulating film, contact hole, or electrode metal on the first device can be carried out together with the corresponding processes for the second device. This improves the efficiency of each fabrication step and thereby reduces manufacturing cost. In addition, interconnections with external leads, other circuit blocks, and TFT arrays become easier, thus reducing the percent yield of defective products caused by interconnection errors with an external device, etc.

The step of forming the first device may further include the steps of: bonding the insulating substrate with the transfer substrate on which the main portion of the first device has been formed and in which hydrogen ions have been implanted; and detaching an unnecessary portion of the transfer substrate by heat treatment, wherein the amorphous Si thin film formed in the step of forming an amorphous Si thin film has a hydrogen content of not more than $1 \times 10^{19}$ cm$^{-3}$.

With the hydrogen content of the amorphous Si thin film not exceeding $1 \times 10^{19}$ cm$^{-3}$, the modifying step does not require the subsequent dehydrogenating annealing process, which is carried out at temperatures that detach the unnecessary portions of the transfer substrate. Thus, during the irradiation of the energy beam in the modifying step, the unnecessary portions of the transfer substrate before they are detached in the later detaching step serve as a heat sink and prevent the first device from being damaged by the heat of the irradiated energy beam. This enables the first device and second device to be monolithically mounted on the insulating substrate by maintaining their characteristics.

Further, because the dehydrogenating annealing process is not required, the number of fabrication steps can be reduced, thereby reducing manufacturing cost.

Further, the method allows the transfer substrate with the first device to be bonded with the flat surface of the insulating substrate before the surface of the insulating substrate is damaged by the irradiated energy beam. As a result, the problem of interconnection error, etc. is prevented.

Further, the fabrication process for the first device and that for the second device can be carried out in conformity after the transfer substrate is bonded to the insulating substrate. More specifically, the processes for forming the insulating film, contact hole, or electrode metal on the first device can be carried out together with the corresponding processes for the second device. This improves the efficiency of each fabrication step and thereby reduces manufacturing cost. In addition, interconnections with external leads, other circuit blocks, and TFT arrays become easier, thus reducing the percent yield of defective products caused by interconnection errors with an external device, etc.

The fabrication method of a semiconductor device according to the present invention may be adapted so that a gate insulating film, a gate electrode, a source-drain impurity implanted region, and an interlayer insulating film are formed on the transfer substrate before the step of bonding the insulating substrate with the transfer substrate, and that a surface of the transfer substrate is planarized and hydrogen ions are implanted therein before the step of bonding the insulating substrate with the transfer substrate.

The method enables the micro fabrication process for the transfer substrate to be carried out before the transfer substrate is bonded to the insulating substrate. This is easier than carrying out such a process after the transfer substrate is bonded to the insulating substrate.

Further, in the fabrication method of a semiconductor device according to the present invention, the first device may be a monocrystalline Si thin film transistor.

With the method, a high-performance and high-function semiconductor device can be obtained that integrates a plurality of circuits of different characteristics. Further, such a semiconductor device can be obtained less expensively than forming all the transistors from the monocrystalline Si thin film on the insulating substrate.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A fabrication method of a semiconductor device in which a first device and a second device are both formed on an insulating substrate wherein the first device is formed on the insulating substrate with its main portion transferred thereon, and the second device is formed on the insulating substrate by being deposited thereon, said method comprising the step of forming the second device after the main portion of the first device is transferred on the insulating substrate, said step of forming the second device including the steps of:

forming an amorphous Si thin film on the insulating substrate; and modifying the amorphous Si thin film to a polycrystalline Si thin film by irradiation of an energy beam, the energy beam being irradiated except for the main portion of the first device.

2. The method as set forth in claim 1, wherein a mask is inserted in an optical path of the energy beam so as to enable the energy beam to be irradiated except for the main portion of the first device.

3. The method as set forth in claim 1, wherein the first device is formed by the steps of:

bonding the insulating substrate with a transfer substrate on which the main portion of the first device has been formed; and detaching an unnecessary portion of the transfer substrate, wherein said step of modifying the amorphous Si thin film is carried out after said step of detaching an unnecessary portion of the transfer substrate.

4. The method as set forth in claim 1, wherein the first device is formed by the steps of:

bonding the insulating substrate with a transfer substrate on which the main portion of the first device has been formed; and detaching an unnecessary portion of the transfer substrate, wherein said step of modifying the amorphous Si thin film is carried out after said step of bonding the insulating substrate with a transfer substrate, and before said step of detaching an unnecessary portion of the transfer substrate.

5. The method as set forth in claim 4, wherein the first device is formed by the steps of:

bonding the insulating substrate with the transfer substrate on which the main portion of the first device has been formed and in which hydrogen ions have been implanted; and detaching an unnecessary portion of the transfer substrate by heat treatment, wherein the amorphous Si thin film is formed by a catalytic CVD method.

6. The method as set forth in claim 4, wherein the first device is formed by the steps of:

bonding the insulating substrate with the transfer substrate on which the main portion of the first device has been formed and in which hydrogen ions have been implanted; and detaching an unnecessary portion of the transfer substrate by heat treatment, wherein the amorphous Si thin film formed in said step of forming an amorphous Si thin film has a hydrogen content of not more than $1 \times 10^{19}$ cm$^{-3}$.

7. The method as set forth in claim 1, wherein:

a gate insulating film, a gate electrode, a source-drain impurity implanted region, and an interlayer insulating film are formed on the transfer substrate before said step of bonding the insulating substrate with a transfer substrate; and a surface of the transfer substrate is planarized and hydrogen ions are implanted therein before said step of bonding the insulating substrate with a transfer substrate.

8. The method as set forth in claim 1, wherein the first device is a monocrystalline Si transistor.

* * * * *